United States Patent [19]

Kaufmann et al.

[11] Patent Number: 5,629,665
[45] Date of Patent: May 13, 1997

[54] CONDUCTING-POLYMER BOLOMETER

[76] Inventors: James Kaufmann, 19845 State Rte. P, Newburg, Mo. 65550; Mary G. Moss, 12901 County Rd. 3000, Rolla, Mo. 65401; Ryan E. Giedd, 1724 W. Highland St., Springfield, Mo. 65807; Terry L. Brewer, 17971 County Rd. 8440, Rolla, Mo. 65401

[21] Appl. No.: 561,357

[22] Filed: Nov. 21, 1995

[51] Int. Cl.$^6$ ............................ H01L 31/08
[52] U.S. Cl. ............... 338/18; 338/15; 338/25; 250/338.1
[58] Field of Search ............... 338/18, 22 R, 338/225 D, 309, 25; 250/338.1, 338.4, 370.08; 374/121

[56] References Cited

U.S. PATENT DOCUMENTS

| | | | |
|---|---|---|---|
| 2,587,674 | 3/1952 | Aiken | 338/18 |
| 2,986,034 | 5/1961 | Jones | 250/338.1 |
| 3,267,403 | 8/1966 | Guarnieri | 338/18 |
| 3,278,783 | 10/1966 | Brissot et al. | 313/390 |
| 3,693,011 | 9/1972 | DeVaux et al. | 338/18 |
| 4,147,562 | 4/1979 | Chiang et al. | 136/213 |
| 4,556,860 | 12/1985 | Tobias et al. | 338/22 SD |
| 4,574,263 | 3/1986 | Liddiard | 338/18 |
| 4,984,963 | 1/1991 | Ballingall | 250/338.1 |
| 5,369,280 | 11/1994 | Liddiard | 250/338.4 |
| 5,426,412 | 6/1995 | Tomonari et al. | 338/18 |

FOREIGN PATENT DOCUMENTS

| | | | |
|---|---|---|---|
| 683075 | 3/1964 | Canada | 338/18 |
| 007926 | 6/1991 | Japan | 338/18 |

OTHER PUBLICATIONS

Dolijack, F. "Polyswitch PTC Devices–A New, Low Resistance, Conductive Polymer–Based PTC Device for Overcurrent Protection" Conf. Proc. of the 31st Electronic Components Conf. 1981, Atlanta, GA May 11, 1981.

*Primary Examiner*—Teresa J. Walberg
*Assistant Examiner*—Karl Easthom

[57] ABSTRACT

The invention is an apparatus and method for making a polymer bolometer. The apparatus consists of a current supply and current receiving paths affixed to a substrate. Bridging the current supply paths and current receiving paths is an electrically conductive polymer. The polymer bolometer may be fabricated using conventional photolithographic techniques.

7 Claims, 2 Drawing Sheets

CONDUCTING-POLYMER BOLOMETER

The United States Government has a paid-up license in this invention and the right in limited circumstances to require the patent owner to license others on reasonable terms as provided for by the terms of grant number III-9362010, awarded by the National Science Foundation, and contract number DAAL03-92-C-0023, awarded by the Ballistic Missile Defense Organization.

BACKGROUND OF INVENTION

1. Field of Invention

This invention relates to the field of thermal detectors, more specifically bolometers and methods of manufacturing said detectors.

2. Description of Prior Art

Visible light is, at times, either inefficient or inappropriate for viewing. At these times, imaging of infrared radiation (IR) becomes an important alternative. Infrared radiation detectors have military and civilian applications. Military applications include weapon sights for individual soldiers, crew-served weapon sights, sensors for missile seekers and as driving aids in vehicles. Civilian uses include thermal imaging for energy efficiency audits, security, analytical instrumentation such as IR spectrometers, and night-time driving aids for automobiles. Typically, a single detector is part of an array of many detectors referred to as an infrared focal plane array (IR FPA).

Detectors of infrared radiation fall into two classes— thermal detectors and photon detectors. Photon detectors depend upon the interaction of photons of infrared light with the solid state electronic structure of the materials; in essence, they measure the rate at which photons interact with the detector. Examples of photon detectors include photoconductive, photovoltaic, MIS and Schottky barrier devices. This application pertains to the field of thermal detectors.

A thermal detector possesses an electrically sensed property which changes magnitude when the temperature of the detector changes; that is, when it absorbs heat from impinging infrared radiation. A thermal detector is, in essence, a phonon detector: incident infrared photons are converted to lattice vibrations, phonons, which affect some property of the detector material. There are three typical types of thermal detectors: (1) pyroelectric in which a temperature change results in an induced charge, (2) thermocouple in which a temperature difference across the detector results in a voltage due to the Seebeck Effect, and (3) bolometric in which a temperature change results in a change in the electrical resistance.

An ideal infrared focal plane array will have a large responsivity (ratio of output signal to input signal), low noise characteristics, be highly uniform, and be easily fabricated using standard semiconductor manufacturing techniques. For a bolometer the response is greatest in a detector which has a large temperature coefficient of resistance (TCR), which relates how much the resistance changes per change in material temperature) and which exhibits a large ratio of temperature change to incident radiation intensity. The thermal conductance of a sensor is a measure of how quickly absorbed heat is lost to its surroundings, a rate proportional to the temperature difference between the detector and its surroundings. Minimizing the thermal conductance minimizes the rate of heat loss. Heat capacity relates how much the temperature of a detector element changes when a certain amount of energy is absorbed. Minimizing the heat capacity maximizes the temperature change per unit energy. This scheme has a constraint: the thermal time constant, which is the ratio of heat capacity to thermal conductance, must be kept below one-half the dwell time of the system for maximum signal. (In this way, the detector element reaches equilibrium before being sampled.) For a system scanning at 60 Hz the dwell time is 8.3 ms.

The theory of noise limitations in uncooled arrays is a highly controversial subject See, for example, Arthur S. Jensen, "Limitations to Room Temperature IR Imaging Systems," *SPIE*, Vol. 2020, pp. 340–350, 1993. Dr. Jensen discusses, among other things, the resistance of the detector elements. His conclusion is that increasing the resistance of the detector decreases the thermal noise generated within the element by the biasing current. A resistance in excess of 50,000 ohms is best, 100,000 ohms is preferred. M. Shulz and L. Caldwell in their article, "Non uniformity Correction and Correctability of Infrared Focal Plane Arrays," *Infrared Physics and Technology*, Vol. 36, pp. 763–777, Aug. 1995, discuss the effect of spatial response uniformity of an array on the thermal imaging resolution of the array. They point out that "the variations may exceed 10% for compound semiconductor FPA's" (HgCdTe, InSb, GeAlAs, etc.). It is well known that it is extremely difficult to produce uniform films of other materials commonly used for room temperature arrays, e.g., vanadium oxide (VOx) and barium strontium titanate (BST). Property variations of 10% or even higher are typical. Patents which disclose the use of these materials do not even discuss uniformity, even though it is vitally important to the performance of a focal plane array.

Many of the materials previously used for focal plane arrays are not easily manufacturable. At this point in time, there is a great effort within the government and industry to improve the manufacturability of these materials—a task which may be beyond even today's advanced technology. A material easily manufacturable in highly uniform films and arrays using standard photolithographic techniques would be a significant advance in the state of the art.

U.S. Pat. No. 3,693,011 discloses a bolometer detector which is formed of 1) an electrical insulator, 2) an electrically resistive zone formed of an ion implanted layer, and 3) associated electrical connections and means by which radiation can be absorbed onto the detector. The electrically resistive layer is formed by implanting metal ions into a glass, alumina, or sapphire substrate to a sufficient dose to cause the resistivity to decrease to $10^5$ ohm/square. The implanted region is supported on top of a base which has a cavity underneath the active element. This method does not address the need to miniaturize and pattern individual elements for the purpose of making infrared detector arrays. In fact, the dimensions of the bolometer elements are given in the patent; the sensitive element is about 1 cm square, the hole has a diameter of about 2 cm, and the film which contains the bolometer element is 0.05 cm thick. While the patent recognizes the need for thermal isolation from the substrate, the thermal mass is much higher than if the film were thinner than one micrometer. It is not likely that the metal ion-implanted alumina film could be easily patterned by lithography, especially to features less than 100 micrometers in size.

A problem which is common to much of the prior art is the inherently low resistivity of the metal alloy residual item, commonly known as permalloy, which is used as the sensing material. A low detector resistance is difficult to measure. U.S. Pat. No. 5,300,915 describes a bolometer designed to overcome the inherently low resistivity of the metal. The patent discloses a serpentine pattern to achieve a resistance of only 2500 ohms. Dr. Jensen, cited above, implies that a resistance on the order of 100,000 ohms would be more desirable—obviously unobtainable with nickel-iron (permalloy). The serpentine pattern has a further disadvantage of a low "fill factor", which is defined as the percent of the total detector area which is composed of the active sensing material. U.S. Pat. No. 5,300,915 discloses a fill factor of 75%, which is improved over the prior art. Thus 25% of the space used by the detector is not used for detector operation.

A number of patents attempt to address the issues of detector responsivity and thermal isolation by several similar approaches. They involve some sort of bridge structure, typically fabricated of silicon nitride or polysilicon, upon which a detector element is formed either through doping of the bridge material or through deposition of a separate material such as permalloy (Ni-Fe). None of the patents, however, thoroughly optimize the heat capacity and thermal conductance or even address the uniformity requirement so necessary for producing a useable focal plane array. Furthermore, as is well known in the industry, none of the arrays meet manufacturability requirements.

U.S. Pat. No. 5,260,225 describes a method for fabricating an infrared sensitive bolometer having a sensing element composed of a polysilicon/doped polysilicon bilayer membrane which is suspended over a cavity. This patent recognizes the need to decrease the thermal conductance to the substrate by placing the conductive, sensing layer on a thermally and electrically nonconductive membrane. This structure, however, has several drawbacks. Fabricating stable, unstressed polysilicon films requires high temperature deposition and annealing processes which are generally considered to be incompatible with complimentary metal oxide semiconductor (CMOS) processing. Furthermore, to produce a film with a large TCR requires an intermediate doping level which results in a very high resistivity and is very difficult to obtain reproducibly. For example, a 1% uniformity of a 2%/K TCR would require a 0.4% dopant uniformity.

U.S. Pat. No. 5,288,649 describes a similar type of bolometer structure in which the sensing element is composed of a four-layer structure consisting of a passivation layer, an infrared absorber, an insulator, and the actual sensing material (a variable resistor made of amorphous silicon doped to approximately 1400 ohm cm). The entire structure is suspended by pillars above the substrate.

U.S. Pat. No. 5,528,976 describes a multilevel structure with reflective metal film on the lower level and a resistive layer of vanadium oxide on the top level. IR absorbance is maximized through the interference of light from two layers. The vanadium oxide is supported on a dielectric film of silicon nitride to form a suspended membrane. However, it has proven to be extraordinarily difficult to produce films of vanadium oxide meeting uniformity and reproducibility requirements.

U.S. Pat. No. 4,371,861 describes the general material properties of the thin film sensing element used in several bolometers. The sensing element is a Ni-Fe permalloy film. This patent describes a method of getting around a major problem with metallic films—its inherent magnetic field dependence. The patent discloses that films with thicknesses in excess of 400 angstroms and line widths less than about 15 micrometers have very small resistance dependence upon a magnetic field.

Clearly, a detector utilizing a material which acts as the bridge structure, the thermal insulating layer, and the detector element optimizes both the detectivity and thermal properties desirable in a focal plane array which is highly uniform, inexpensive, compatible with CMOS and other standard semiconductor processes; and which would be manufacturable would be a significant improvement over the prior art.

OBJECTS OF THE INVENTION

It is an object of the present invention to provide a small polymer bolometer, approximately 50 microns square and smaller.

It is a further object of the present invention to provide a polymer bolometer which takes up as little space as possible.

It is a further object of the present invention to provide a polymer bolometer with an improved temperature coefficient response.

It is a further object of the present invention to provide a polymer bolometer which is not influenced by a magnetic field.

It is a further object of the present invention to provide a polymer bolometer with a resistance of 10K ohms or greater and a high fill factor.

It is a further object of the present invention to provide a polymer bolometer located in an array which can be thermally isolated from other detectors.

It is a further object of the present invention to provide a method of manufacturing polymer bolometers using photolithography techniques.

SUMMARY OF THE INVENTION

The present invention is an apparatus and method which overcomes the deficiencies in the prior art. The device is a polymer bolometer which has lower thermal mass, is highly responsive to impinging infrared radiation, highly uniform, and capable of being patterned to single layer elements thermally isolated from the substrate.

The present apparatus consists of a current supply path and a current receiving path affixed to a non-conductive substrate. Bridging the paths is an electrically conductive polymer referred to as the sensor bridge. The polymer is an ion implanted polymer.

The method of creating the apparatus involves the use of conventional photolithographic methods.

DETAILED DESCRIPTION OF THE INVENTION

Figure 1:
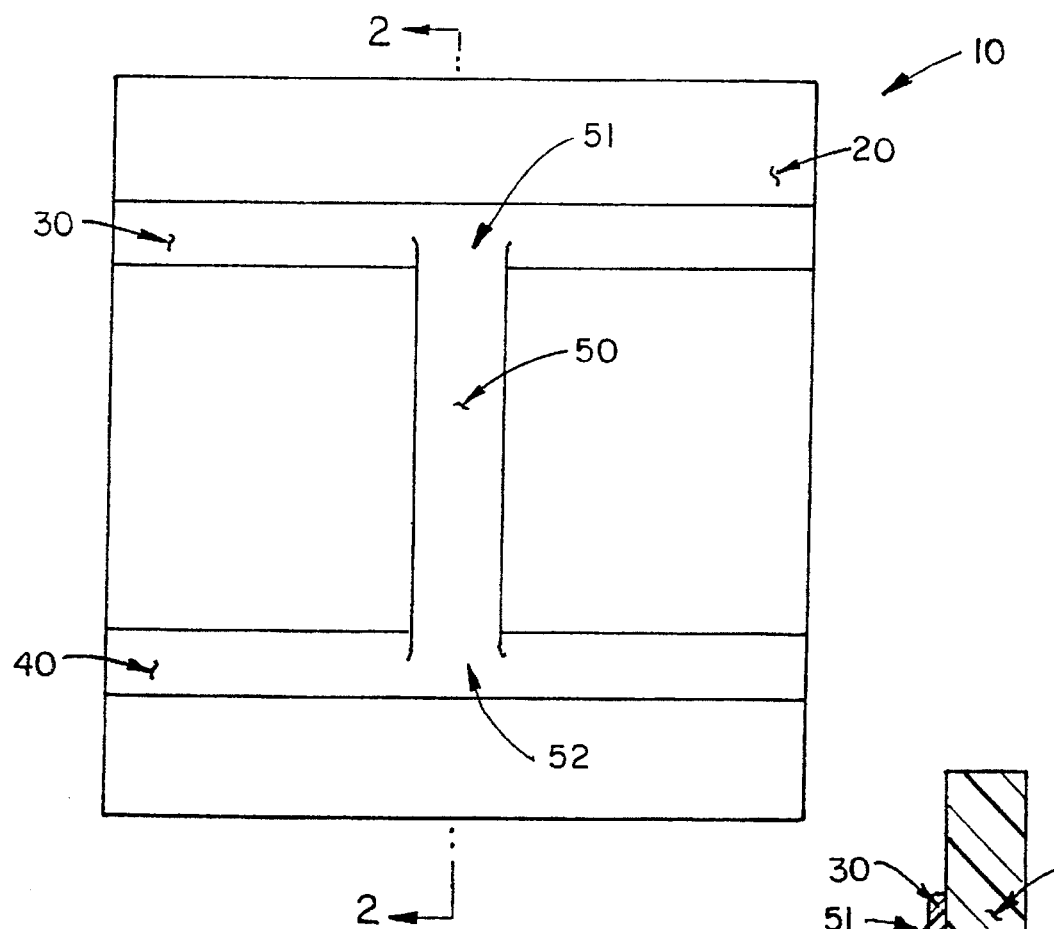
FIG. 1 illustrates an overhead view of a single pixel element of a polymer bolometer of the present invention.
Figure 2:
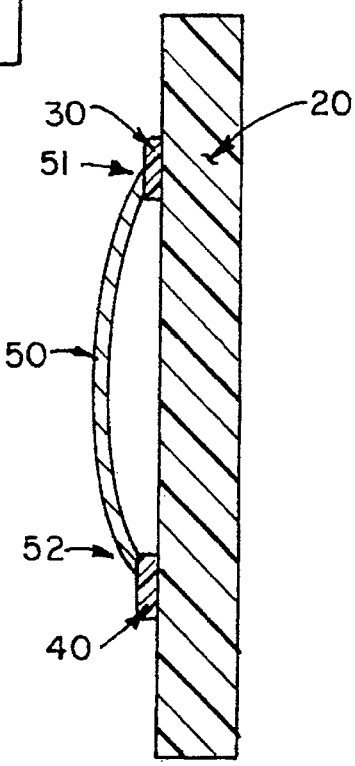
FIG. 2 illustrates a side view of a single pixel element of a polymer bolometer of the present invention.

Referring to FIG. 1, it is possible to view the various major elements constituting the present invention (10). The present invention has four major elements. These elements are the substrate (20), the current supply means (30), the current receiving means (40) and the sensor bridge (50).

The substrate (20) is an electrically non-conductive material such as glass. However, any electrically non-conductive material may be used. Any substrate which can support a uniform high quality film could be used for the manufacture of the polymer based bolometers. For example, the bolometers could be made on aluminum oxide, quartz, a variety of polymers, or even conductive substrates, such as metals or semiconductors, which have an insulating layer deposited on them. This freedom and flexibility allows the ability to choose a substrate which has a low thermal conductivity which would result in better detector response.

The current supply means (30) is an electrically conductive pathway such as gold. A variety of conductive materials may be used, such as metals, highly conductive polymers, highly doped semiconductors, or any method of forming electrical interconnects or pathways which would be familiar to one skilled in the art. Similar to current supply means (30) is the current receiving means (40). The current receiving means is also an electrically conductive pathway such as gold. The current supply means (30) and current receiving means (40) are electrically isolated from each other.

Connecting the supply and receiving means is the sensor bridge (50). This element is connected to the supply means at (51) and 'bridges' over the substrate (20) to connect with the receiving means at (52). It is desirable for the bridge to avoid contact with the substrate so as to decrease loss of heat from thermal conduction to the substrate. The sensor bridge of the present invention is a polymer which has been made electrically conductive by ion implantation. The polymers for implantation can be copolymers of styrene with nitrile-containing acrylic polymers such as polyacrylonitrile or polymethacrylonitrile. Other polymers which can be conveyed in an organic solvent or water can be used. They include soluble acrylic polymers, polyethers, and polyimides and their precursors, polyesters, polyurethanes, polysulfones, polybenzocyclobutanes, phenolformaldehyde resins, or soluble versions of polyaniline or other intrinsically conductive polymers. While the term polymer is used throughout, it is understood that oligomers, thermosetting polymer precursors, or other organic compounds which can form a continuous, high quality film on a substrate, or those materials which can form free-standing films, can be employed. Implantation is conducted using positive ions (preferably nitrogen, but other ions can be used). The conductivity of the implanted polymer is a strong function of the fluence, the ion energy, the polymer type, and polymer thickness. Using 50 KeV ions, fluences greater than $1\times10^{15}$ ions/cm$^2$ can be used, with the preferred fluence being greater that $1\times10^{16}$ ions/cm$^2$. Ion energy can range from 25 KeV to 20 MeV, with the preferred range from 35–250 KeV.

The implanted films are highly resistant to corrosive chemicals, organic solvents, and moisture, and do not change resistance on exposure to chemicals which are solvents for the unimplanted, precursor polymer. The excellent solvent resistance enables the spincoating, exposure, and patterning of photoresist, and the etching of underlying layers without changing the resistance of the polymer film.

Another advantage to the polymer composition is that such a bolometer is unaffected by magnetic interferences. This is due to the organic nature of the polymer sensor bridge. To test the level of magnetic inference of the present invention the resistance of a 1-inch×1-inch sample was measured when exposed to a magnetic field of 10,000 gauss. Less than 1% change in resistance occurred. This obviates the need for complex film arrangements as disclosed in U.S. Pat. No. 4,371,861.

Figure 3:
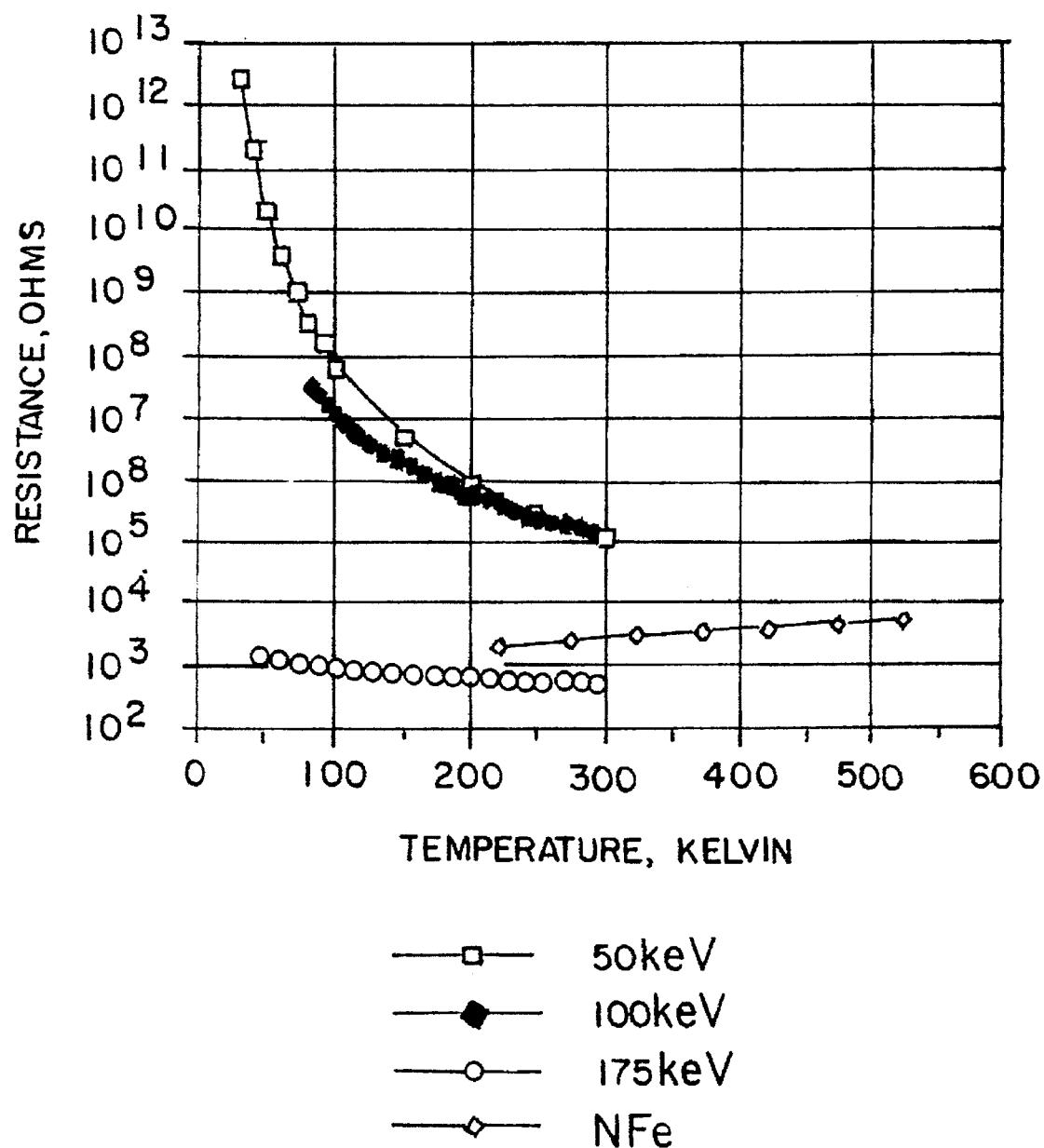
FIG. 3 illustrates the resistance-temperature (R/T) behavior of two ion implanted films used in the present invention and the R/T behavior of a NiFe alloy used in the prior art.

Additionally, FIG. 3 is a graph which shows the resistance-temperature (R/T) behavior of a NiFe permalloy and several ion implanted films. The steepness of the resistance-temperature curve in all cases is equivalent to or greater than the Ni-Fe permalloy material which is magnetic field sensitive and has the low resistance limitations discussed in the previous section.

Polysilicon has been used in the prior art as the sensing material. The ion implanted polymer materials have several advantages over doped polysilicon. Polysilicon is typically deposited by chemical vapor deposition at a temperature greater than 600° C. Doping is achieved by ion implantation or by diffusion. Doping of polysilicon by ion implantation requires a high temperature annealing step. The high temperature processing required for polysilicon deposition is not compatible with CMOS circuitry which may be needed on the same chip as the IR detector. In addition, doping of polysilicon by diffusion to an intermediate conductivity is extremely difficult to control and the resulting conductivity may not be uniform, as described in S. Ghandi, *VLSI Fabrication Principles*, 2nd ed. (1994). Finally, polysilicon deposition requires the handling of silane gas, which is highly flammable. The ion implanted polymer process is a low-temperature, safe process which results in highly uniform properties.

Furthermore, the present invention has a higher resistivity. Tests have shown a sheet resistivity from 200 to $2\times10^7$ ohms/ square. When compared to detectors using permalloy materials (e.g., U.S. Pat. No. 5,300,915), which typically have a resistance of 13 ohms/square, the advantages of the present invention are significant. To achieve a resistance of 50,000 ohms, for example, the detector of U.S. Pat. No. 5,300,915 would require a length to width ratio of 1 to 0.00026 (a line 15 microns wide and 57,700 microns long!). The present invention would require a length/width ratio of 1 to 1and would exhibit a much improved TCR.

Also, there are several advantages to using a polymer-based sensor bridge. Specifically, a polymer has a lower detector mass and therefore a lower heat capacity. This means that the detector will exhibit a larger temperature change when exposed to the same IR radiation than will a detector with a larger heat capacity. Also, since the polymer is also the bridge structure, thermal losses due to thermal conductivity of the bridge itself is minimal/miniscule. Thermal conductivity can be further reduced by using the conductive polymer as the supply and receiving means.

As an example, compare a bolometer made using the materials of the present invention as opposed to the design in U.S. Pat. No. 5,260,225. For a fair comparison, using the equations quoted in the patent and replacing the values of heat capacity, thermal conductivity, and TCR as appropriate for the present materials ($2.8\times10^{-10}$ J/K, $8.8\times10^{-8}$ W/K, 2%/K, respectively), gives a factor of seven improvement in the figures of merit (responsivity and detectivity). Although polymers are intrinsically good infrared absorbers, additional improvements can be realized by coating the sensor bridge with an IR absorber or by loading the polymer itself with an IR absorbing dye which would simplify processing even further.

Furthermore, since the values of interest (TCR, resistance, etc.) occur on plateaus for the polymeric materials, not on steep curves as for the doped polysilicon, they are much more stable to process variations which vastly improves their manufacturability and uniformity over any existing detector materials. Consider as a further example a four-inch diameter silicon wafer with a two-micron thick oxide layer. Four resistors measuring approximately 2 mm by 2 mm patterned from implanted poly(styrene-co-acrylonitrile) distributed over a several square inch area exhibited a temperature coefficient of resistance of 2%/K±0.03%/K. The 1.5% variation attributable to temperature measurement errors.

Finally, the materials of the present invention strongly adhere to the substrate and the bridge and the detector elements are all fabricated from the same material, obviating concerns about delamination or adhesion which plague multilayered structures.

To manufacture the present invention, conventional photolithographic techniques may be utilized. The manufacture of the present invention includes steps common in the semiconductor industry. The electrical interconnects (the current supply means and the current return means) are deposited on a silicon wafer substrate on which a 2 micron thick silicon oxide has been grown. The interconnects or pathways are then patterned by photolithography. A polymer film is deposited by spin coating or other techniques, such as roller coating or meniscus coating, which can be used to form a high quality thin film. The film is then implanted with energetic ions to a fluence of preferably $5 \times 10^{16}$ ions/cm$^2$. The sensor bridge is patterned by coating with photoresist and imaging the resist to form an etch mask. The implanted polymer film is removed, where not protected by the photoresist mask, by reactive ion etching. The photoresist may then be removed by an appropriate solvent. The sensor bridge may be released from the substrate to form a free standing bridge by dissolving the silicon oxide in hydrofluoric acid. The detector elements are released before significant undercutting of the interconnects or pathways occurs. Albeit this is the preferred method of forming the sensor, it is not the only method available to those skilled in the art and a variety of methods may be used to form the sensor bridge utilizing a variety of substrates and pathways. A single detector can range from approximately 5 microns by 5 microns in size to 50 microns to 50 microns. The patterned devices may be packaged by standard techniques.

It will be obvious to those skilled in the art that various changes may be made without departing from the scope of the invention and the invention is not to be considered limited to what is illustrated in the drawings and described in the specification.

What is claimed:

1. A bolometer comprising:
    (a) an electrically non-conductive substrate;
    (b) means for supplying an electric current affixed to the substrate;
    (c) means for receiving an electric current affixed to the substrate and electrically isolated from the supply means; and
    (d) an electrically conductive polymer single layer sensor bridging over said substrate with a first end electrically connected to said supply means and a second end electrically and physically connected to said receiving means, while otherwise avoiding contact with the substrate.

2. The bolometer described in claim 1, wherein the polymer sensor bridge is an ion implanted polymer.

3. The bolometer described in claim 2, wherein the supplying means and receiving means are a conductive material selected from the group of gold, metals, highly conductive polymers and highly doped semiconductors.

4. The bolometer described in claim 3, wherein the substrate is a non-conductive material selected from the group of glass, aluminum oxide, quartz, polymers and insulated conductive substrates.

5. The bolometer described in claim 4, further comprising an infrared absorbing layer affixed to the sensor bridge.

6. The bolometer described in claim 4, further comprising an infrared absorbing dye within the sensor bridge.

7. A bolometer comprising:
    (a) a glass substrate;
    (b) a gold current supply pathway coated onto the substrate;
    (c) a gold current receiving pathway coated onto the substrate and electrically isolated from the supply pathway; and
    (d) an electrically conductive ion implanted polymer layer bridging over said substrate with the first end electrically and physically connected to the supply pathway and a second end electrically and physically connected to the receiving pathway said layer otherwise avoiding contact with the substrate.

* * * * *